US005218305A

United States Patent [19]

Lunzer

[11] Patent Number: 5,218,305
[45] Date of Patent: Jun. 8, 1993

[54] APPARATUS FOR TRANSMITTING ELECTROSTATIC SPRAY GUN VOLTAGE AND CURRENT VALUES TO REMOTE LOCATION

[75] Inventor: Lawrence J. Lunzer, St. Louis Park, Minn.

[73] Assignee: Graco Inc., Golden Valley, Minn.

[21] Appl. No.: 791,429

[22] Filed: Nov. 13, 1991

[51] Int. Cl.[5] .......... G01R 29/12; B05B 5/025

[52] U.S. Cl. .......... 324/457; 239/690; 361/227

[58] Field of Search .......... 324/457, 458, 120, 127, 324/96; 455/42, 66, 67.1; 239/690; 361/227, 228

[56] References Cited

U.S. PATENT DOCUMENTS

| | | | |
|---|---|---|---|
| 3,081,629 | 3/1963 | Clauss et al. . | |
| 3,641,971 | 2/1972 | Walberg . | |
| 3,645,447 | 2/1972 | Cowan . | |
| 4,266,262 | 5/1981 | Haase, Jr. . | |
| 4,634,057 | 1/1987 | Coffee et al. . | |
| 4,682,735 | 7/1987 | Mommsen . | |
| 4,978,075 | 12/1990 | Lind et al. | 239/690 |
| 4,986,471 | 1/1991 | Hethcoat | 324/457 X |
| 5,063,350 | 11/1991 | Hemming et al. | 324/457 |

*Primary Examiner*—Gerard R. Strecker
*Assistant Examiner*—Diep Do
*Attorney, Agent, or Firm*—Palmatier, Sjoquist & Helget

[57] ABSTRACT

An electrostatic spray gun having a self-contained power supply including a high voltage electrostatic voltage and current source, with circuits for monitoring the voltage and current and developing a frequency signal based on the monitored voltage and current, circuits for modulating the frequency signal with a radio frequency carrier and transmitting the modulated-carrier signal to a remote radio receiver, where the signals are demodulated and converted to a digital display representation of the monitored voltage and/or current.

9 Claims, 12 Drawing Sheets

RF RECEIVER SECTION

APPARATUS FOR TRANSMITTING ELECTROSTATIC SPRAY GUN VOLTAGE AND CURRENT VALUES TO REMOTE LOCATION

BACKGROUND OF THE INVENTION

This invention relates to electrostatic spray guns for spraying paint and the like, and more specifically relates to an electrostatic spray gun voltage monitoring system wherein the operating voltage of the spray gun may be monitored at a location remote from the spray gun.

In the operation and use of electrostratic spray guns there is a need to be aware of the operating electrostatic voltage of the spray gun during use, and there is also a need to know the magnitude of the electrostatic current delivered by the spray gun during use. The electrostatic voltage is important in terms of controlling efficiency of the painting operation, for the ability of the spray gun to efficiently deliver paint to the article is directly related to the spray gun voltage. As the voltage decreases the spray painting efficiency also decreases, and a larger volume of paint spray particles are not attracted to the article, but rather pass the article as overspray, and this overspray contributes to environmental pollution. Special spray booth constructions must be prepared in order to collect and dispose of overspray, adding to the cost of the overall painting system. It is important to monitor the magnitude of the spray gun current, for higher current levels indicate the possibility of an imminent hazardous ignition condition. Since it is known that electrostatic spray guns are operated in an environment containing highly volatile or flammable materials, the possibility of explosions must always be kept in mind and the need to monitor current is therefore very important.

Further, the hazardous environment of spray gun operation dictates that electrical connections to an electrostatic spray gun be held to a minimum, and where necessary, be maintained in an extremely secure explosion-proof and intrinsically safe environment. It is preferable to operate electrostatic spray guns without any electrical connections whatsoever to external circuitry or power sources, so that no possibility exists of electrical shorting to the external environment. The assignee of the present invention has developed a line of electrostatic spray guns which are operated solely by high-pressure air transmitted to the gun, and wherein the air is used not only for spraying the paint but also to drive a self-contained turbine generator within the electrostatic spray gun body. The output of the turbine generator is used to develop a suitable high voltage which is applied to an electrode in the electrostatic spray gun, to develop the necessary electrostatic field for efficient painting operations. Because this spray gun operates with no external electrical connections it is a particular problem to monitor the voltage and current generated at the spray gun, especially when there is a need to monitor such voltage and current at a remote location.

Several prior patents disclose features which are related to some of the features of the present invention, the disclosures of which are incorporated by reference herein. U.S. Pat. No. 4,219,865, issued Aug. 26, 1980, discloses an energy converting an electric power generating system for electrostatic spray guns, wherein the kinetic energy available in a moving air stream is converted into electrical power by means of an air turbine/alternator/high voltage power supply. U.S. Pat. No. 4,290,091, issued Sep. 15, 1981, discloses some of the circuit features which are usable with the air turbine power supply in an electrostatic spray gun. U.S. Pat. No. 4,462,061, discloses certain improvements in the air passages in an air turbine electrostatic spray gun. U.S. patent application Ser. No. 478,276, filed Feb. 9, 1990, discloses an electrostatic spray gun of the foregoing type, having a remote voltage and current monitor circuit utilizing fiber-optic cables for signal transmission. All of the foregoing patents are owned by the assignee of the present invention.

SUMMARY OF THE INVENTION

It is a principal object of the present invention to provide an electrostatic spray gun voltage and current monitoring system, wherein the monitor is remotely locatable from the electrostatic spray gun.

It is another object of the invention to provide a remote monitoring system having no direct electrical connections to the electrostatic spray gun.

It is a further object of the present invention to provide a remote monitoring system which is entirely safe and protected from the hazardous environment of the spray gun..

The invention utilizes a voltage sensor and current sensor built into the body of the electrostratic spray gun, each of which are electrically connected to a radio frequency generator, also built into the body of the spray gun. The radio frequency generator develops frequency modulated (FM) signals representative of voltage and current, and transmits these signals over a preferred wavelength and under low transmission power conditions. A remote receiver capable of receiving the signals is provided, with circuitry within the receiver for decoding the radio frequency information and converting it into digital information suitable for display. The remote receiver also incorporates a digital display module for providing a visual representation of the magnitude of voltage and current for viewing by a user.

DESCRIPTION OF THE DRAWINGS

The foregoing objects of the invention are achieved by the novel apparatus described herein, and with reference to the appended drawings, in which.

DESCRIPTION OF THE PREFERRED EMBODIMENT

Figure 1:
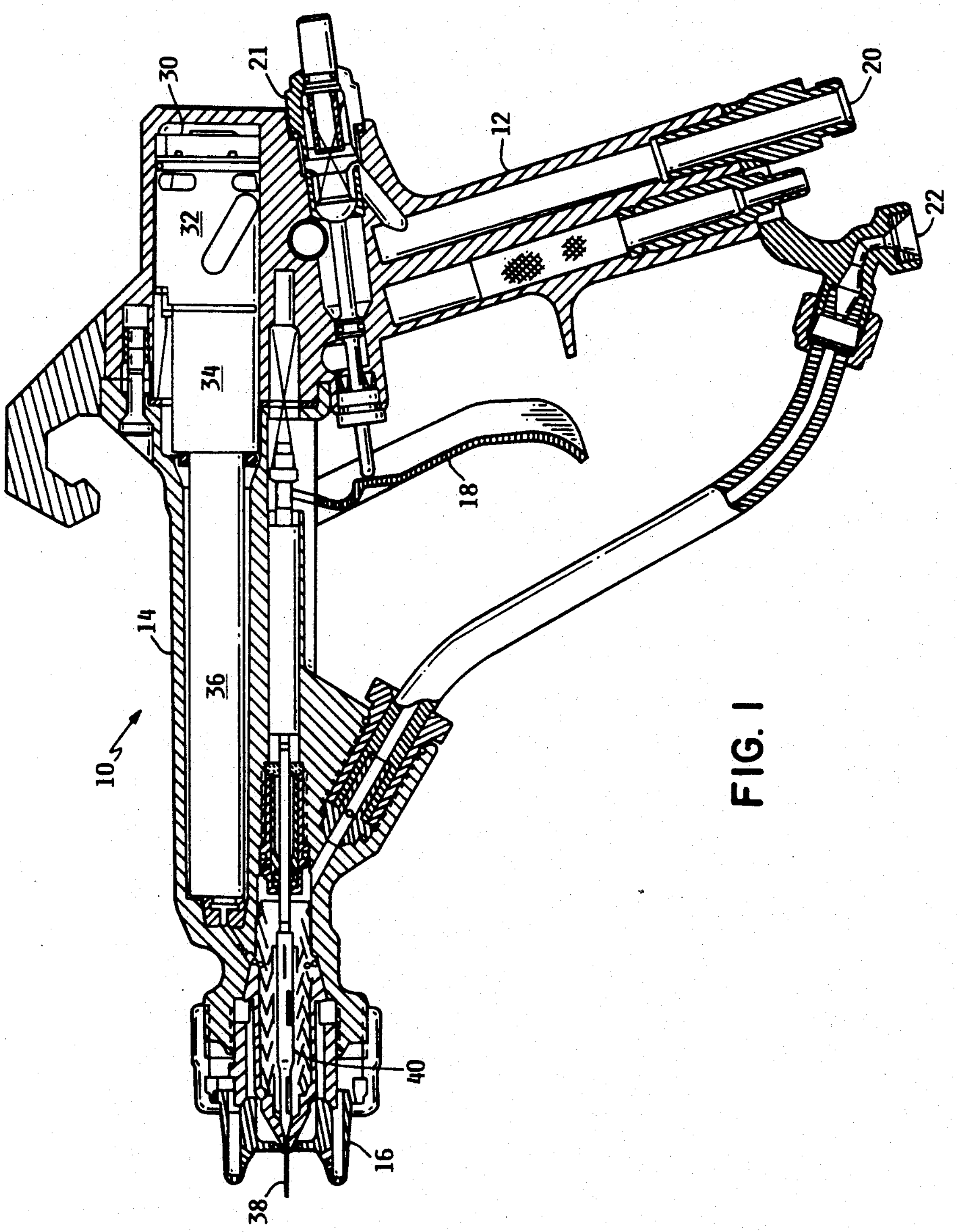
FIG. 1 shows an electrostatic spray gun in partial cross section.

Referring first to FIG. 1, there is shown an electrostatic spray gun 10 in partial cross-section view. Spray gun 10 has a handle 12, a barrel 14, a spray nozzle 16, and a trigger 18. An air inlet 20 is formed at the base of handle 12, and an air valve 21 controls the volume of air flow through the gun via passages (not shown). A liquid or paint inlet 22 is also attached near the base of the spray gun, and paint entering therein is conveyed via passages to spray nozzle 16. A spray valve 40 is retractable by operation of trigger 18 to permit the liquid or paint to be emitted through an orifice at the front of spray nozzle 16. Spray valve 40 has an electrode 38 projecting from its forward end. Electrode 38 is electrically connected to a high voltage section 36 which is contained within the body of spray gun 10. High voltage section 36 is connected to an oscillator section 34, which is in turn connected to a low voltage section 32. Low voltage section 32 is connected to an air turbine/alternator 30, located near the rear end of spray gun 10. The air passages via air valve 21 are coupled into air flow relationship with air turbine/alternator 30, to cause a rotating turbine member to mechanically drive an alternator so as to produce an alternating voltage directly proportional to the rotational speed of the turbine.

Figure 2:
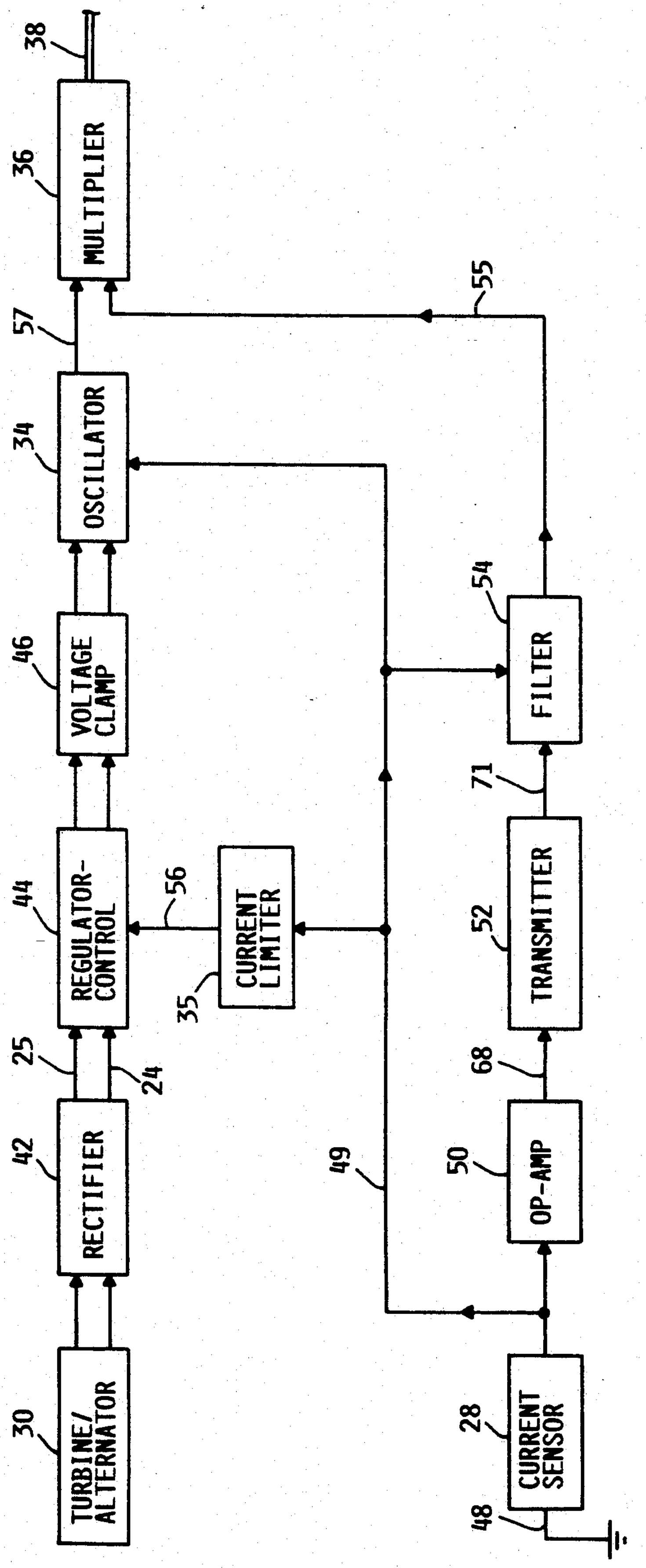
FIG. 2 shows a functional block diagram of the transmitting circuits of the present invention.

In the preferred block diagram embodiment shown in FIG. 2, the alternating voltage developed by turbine/alternator 30 is approximately 20 volts AC at 700 hertz (Hz). The alternating voltage is coupled into a rectifier 42 to convert it to an unregulated DC voltage, having a nominal value of about 19 volts DC. This unregulated DC voltage is coupled into voltage regulator-control circuit 44, which develops a relatively constant DC output voltage that is adjustable over a narrow range; i.e., typically 15.0–17.6 volts DC. The output from the regulator-control circuitry 44 is coupled into a voltage clamping circuit 46 to prevent overvoltage. This circuit limits the maximum DC output voltage from regulator-control circuit 44 to between 17.6 volts and 18.5 volts in the preferred embodiment. The voltage is then applied to an oscillator circuit 34, which converts the regulated input voltage to a high frequency alternating voltage; the frequency of this voltage is typically 24.5 KHz. The oscillator circuit 34 also contains a step-up transformer which provides an output voltage of approximately 10,000 volts peak to peak. This stepped-up voltage is applied to a multiplier circuit 36 which steps up the voltage to approximately 85,000 volts DC. The output voltage is delivered to an electrode 38 via very large-value output resistors, and the output voltage produces an electrostatic field emanating from electrode 38 to assist in the paint spraying process. A current sensor 28 monitors the ground return current and develops a signal representative of this current, which signal is coupled to current-limiter circuit 35, to control the maximum current obtainable from the spray gun 10. The current-limiter 35 is typically preset to limit the output current to 120 microamps, and the current-limiter 35 is coupled back to regulator-control circuitry 44 to lower the regulated voltage whenever the output current approaches the 120 microamp limit.

The electrostatic voltage and current which flows through multiplier 36 and electrode 38 is conveyed to a grounded article (not shown) in a typical operating environment. The current flows to ground, and is returned to the spray gun via grounded connections in the hose which delivers air to the spray gun. These ground connections are connected to the body of the spray gun 10, particularly handle 12, and the connection is represented on FIG. 2 as a ground connection 48, at the input of current sensor circuit 28. Current sensor circuit 28 develops a signal proportional to the ground return current, and couples the signal to an operational amplifier circuit 50, current-limiter circuit 35, and filter circuit 54. Operational amplifier 50 is connected to transmitter 52, which converts the signal to a frequency-modulated radio frequency (FM), nominally about the FM frequency of 49.890 MHz. The modulation range is typically +4.2 KHz/−3.2 KHz. The modulated frequency is coupled through a filter 54 to remove all frequencies other than the desired transmitting frequency, and the signal is then applied to the return side of multiplier 36. This FM signal passes through multiplier 36 and becomes transmitted via electrode 38.

Figure 3:
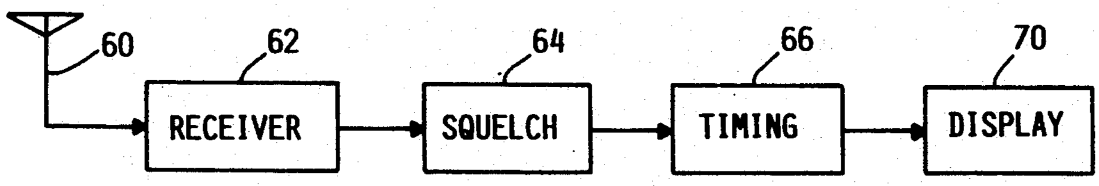
FIG. 3 shows a functional block diagram of the receiving circuits of the present invention.

FIG. 3 shows a functional block diagram of the receiving portion of the present invention. An FM receiving antenna 60 is connected to a receiver circuit 62. Receiver circuit 62 is connected to a squelch circuit 64, which in turn develops an output signal to a timing and logic circuit 66. Timing and logic circuit 66 develops a digital signal which is transmitted to a display circuit 70, which includes a visual display for displaying a numeric value which is representative of the spray gun output voltage.

The foregoing circuits will be described in greater detail hereafter, and with reference to FIGS. 4–10. The circuit component values shown in FIGS. 4–10 are represented in a conventional manner; i.e., resistors are shown in ohms unless otherwise designated, capacitances are shown in microfarads (uf) or picofarads (pf), and semiconductor components are identified by their commercial and/or industrial type designations.

Figure 4:
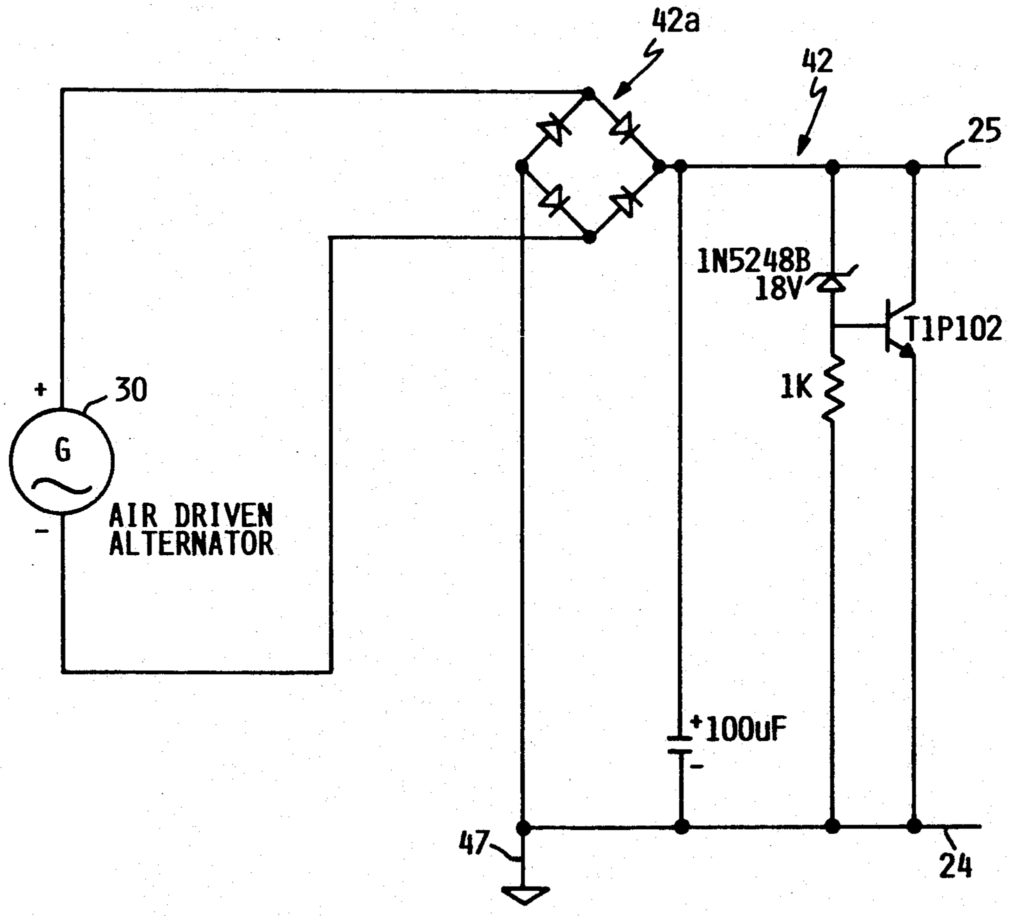
FIG. 4 shows a schematic diagram of portions of the spray gun circuitry.

FIG. 4 shows the turbine/alternator 30 in symbolic form, and the circuit schematic associated with rectifier 42. A full-wave rectifier **42*a* is connected to receive the alternating current output from turbine/alternator 30. Rectifier 42*a* is connected to ground via connection 47. An unregulated DC voltage of approximately 18–19 volts DC is developed between output lines 24 and 25; output line 24** forms a ground return path for the electrical circuits described herein.

Figure 5A:
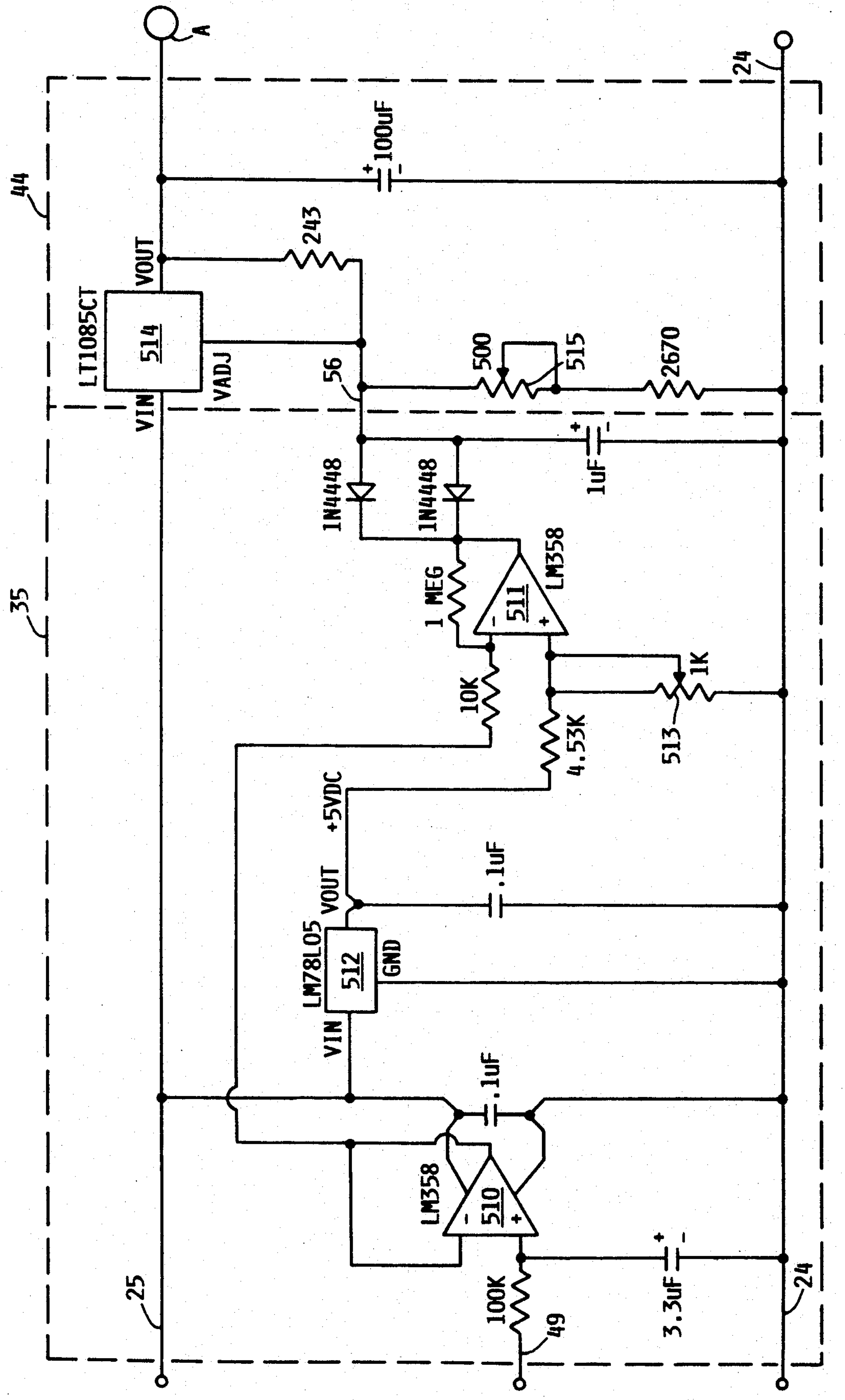
FIG. 5A and FIG. 5B each show a schematic diagram of portions of the spray gun circuitry.

FIG. 5A shows a schematic diagram of regulator-control circuit 44 and current-limiter circuit 35. Both of these circuits receive the unregulated DC output voltage from rectifier 42 via lines 24 and 25; current-limiter 35 utilizes this unregulated DC voltage for its power, and regulator-control circuit 44 converts the unregulated DC voltage to a regulated DC voltage at output terminal A, via a voltage regulator semiconductor Type LT1085CT. The regulated voltage at terminal A lies within the range of 15.0–17.6 volts DC.

Current-limiter 35 has its input connected to line 49, which is the output from current-sensor circuit 28. Current-limiter 35 develops an output voltage at line 56 which is coupled to regulator-control circuit 44 to adjust the voltage regulator output. The input signal from line 49 is amplified by amplifier 510 and presented as one input to inverting amplifier 511. The other input to inverting amplifier 511 is provided by voltage regulator 512, which has a commercial designation of Type LM78LO5. Voltage regulator 512 provides a regulated DC output voltage which is coupled to the series resistance including potentiometer 513. Potentiometer 513 adjustably provides a set-point voltage for inverting amplifier 511, and is typically set at a value to limit the maximum output current from multiplier 36 to 12 microamps. The output from inverting amplifier 511 is fed through a parallel pair of diodes to line 56, which is coupled to regulator-control circuit 44.

Regulator-control circuit 44 incorporates a voltage regulator 514, which has a commercial type designation of LT1085CT. It receives an unregulated DC input voltage on line 25, and a control signal on line 56, to produce a regulated output voltage to output terminal A. Resistor 515 may be initially set under no-load conditions to produce an output voltage of about 85 Kv at electrode 38, and thereafter the current-limiter 35 will monitor the current loading conditions to limit the maximum current flow from multiplier 36 to 120 microamps. Since multiplier 36 and its associated internal resistances present an essentially resistive load, the voltage/current characteristics of multiplier 36 are very nearly a linear line; i.e., the output voltage at electrode 38 drops linearly as the output current via electrode 38 increases.

Figure 5B:
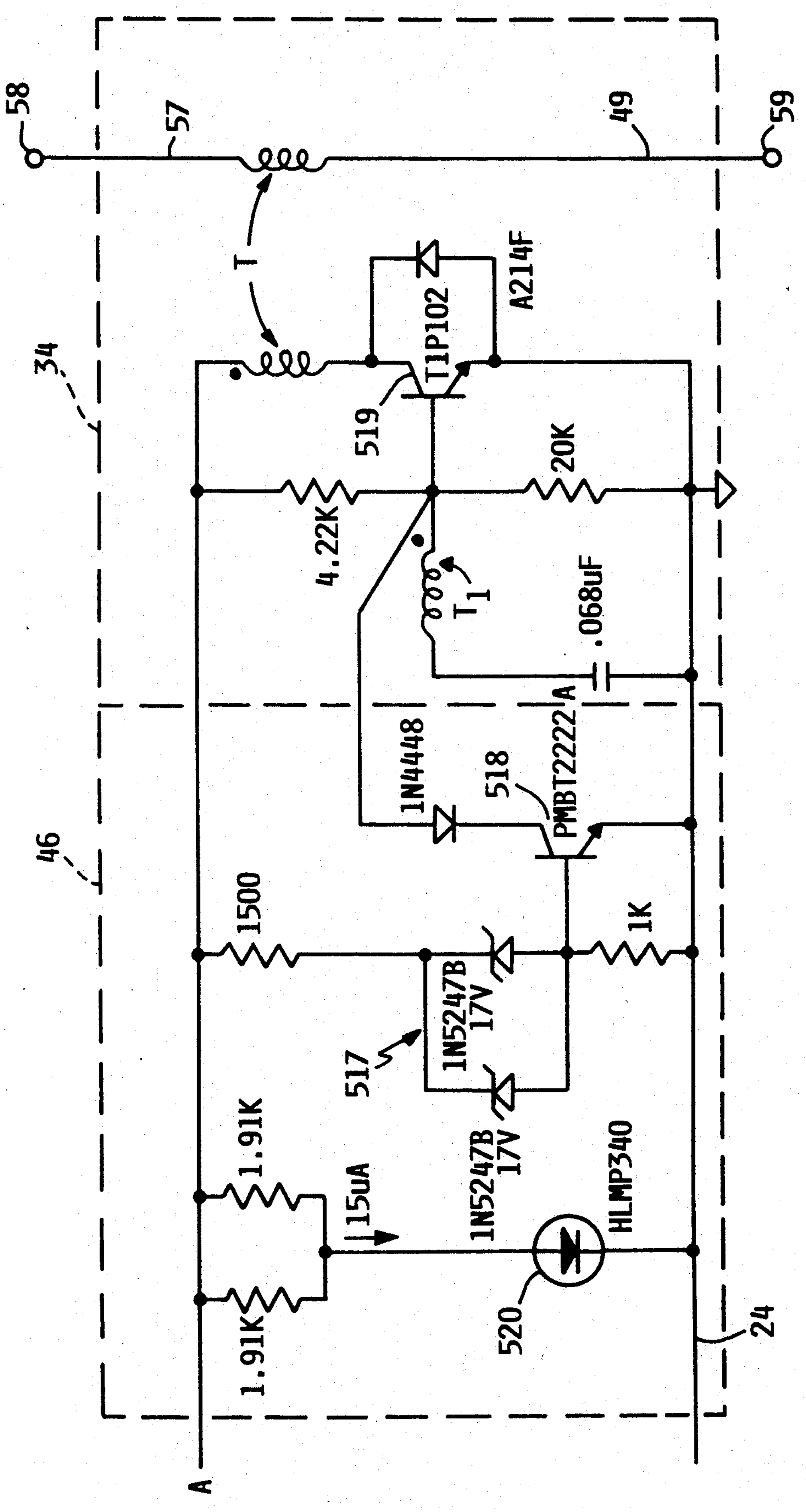

Terminal A is connected to a voltage clamp circuit 46, shown in FIG. 5B, which clamps the output regulated voltage to the range 17.6–18.5 volts. If voltage regulator 514 fails in a shorted condition, the full unregulated voltage could be applied to oscillator 34, thereby allowing the multiplier 36 output voltage to rise in excess of 85 Kv. Voltage clamp circuit 46 prevents this from occurring by turning on zenor diodes 517 whenever the voltage at terminal A reaches 17.6 volts. This causes transistor 518 to turn on and transistor 519 to turn off, thereby shutting down the oscillator 34. Under normal operating conditions transistor 518 is turned off and transistor 519 is coupled into an oscillator circuit in conjunction with step-up transformer T and transformer winding T1. This combination produces a high frequency output signal of approximately 24.5 KHz, across terminals 58 and 59, at a voltage of approximately 10,000 volts peak to peak. Output terminal 59 is connected to line 49, to current sensor 28. Output terminal 58 is connected to line 57, which is the high voltage power input line to multiplier 36.

FIG. 5B also illustrates another feature of the invention which may be advantageous in many applications. A light-emitting diode circuit 520 is coupled in series with a resistance across the input line voltage. Light-emitting diode circuit 520 will therefore illuminate whenever voltage is applied at terminal A, and may provide an indication that power is operable within the spray gun. This light illumination is a helpful indicator to the operator, as a means of verifying that the electrostatic spraying voltage is properly operating.

Figure 6:
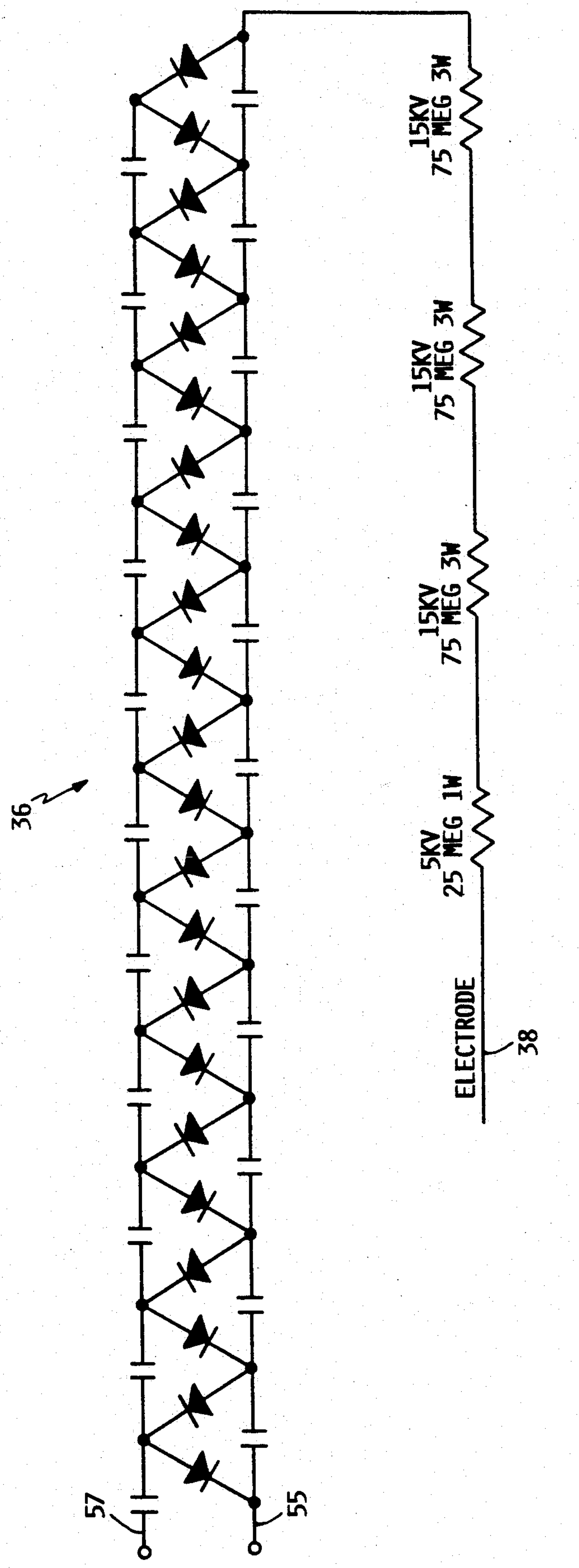
FIG. 6 shows a schematic diagram of the spray gun voltage multiplier and electrode.

FIG. 6 shows a schematic diagram of multiplier 36, including the high resistance coupled between the output of multiplier 36 and electrode 38. At the DC current values which are typically operational with circuits of this type, electrode 38 may have an output voltage of approximately 85 Kv under no-load conditions. As the current flow from electrode 38 increases, the output voltage at electrode 38 decreases.

Figure 7:
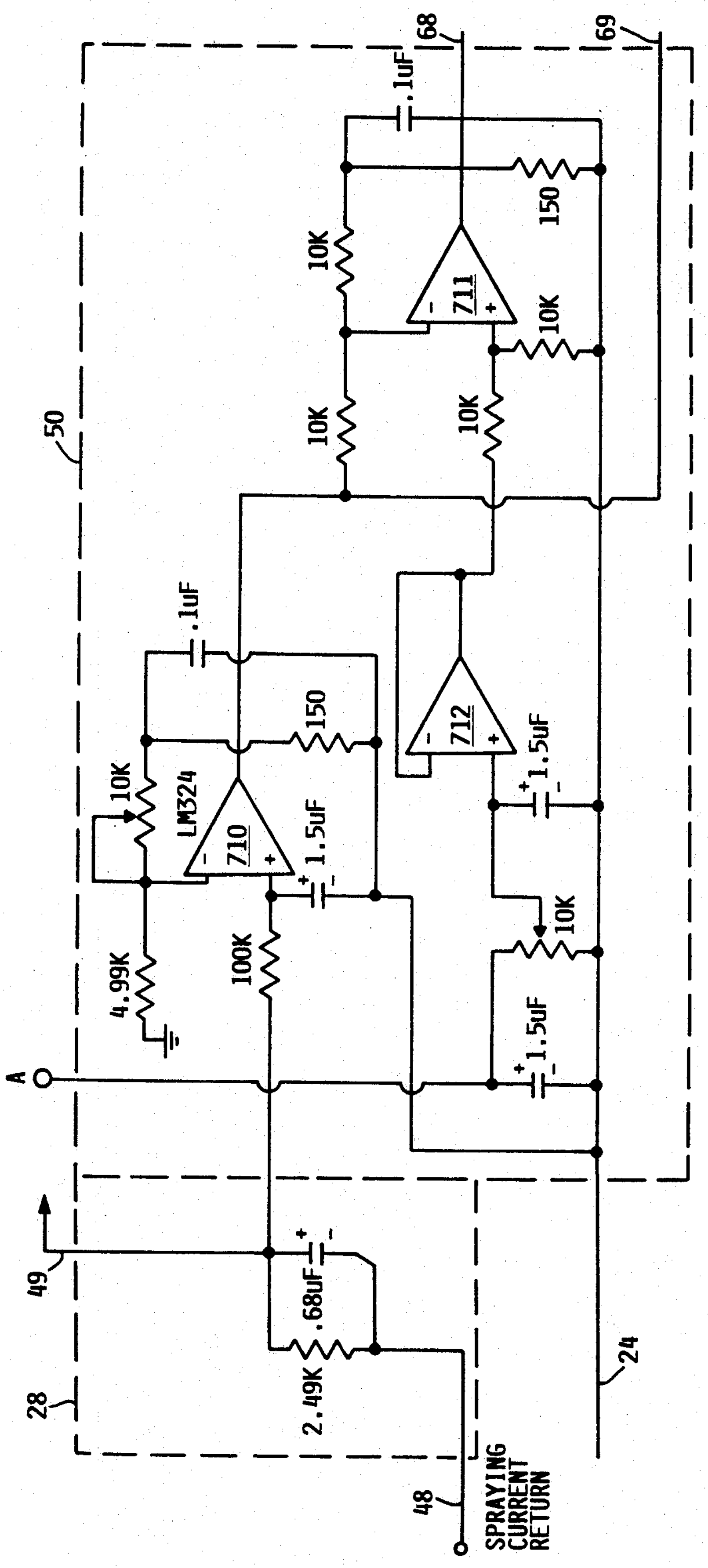
FIG. 7 shows a schematic diagram of the current sensor and operational amplifier.

FIG. 7 shows a schematic diagram of current sensor circuit 28 and operational amplifier circuit 50. Current sensor circuit 28 receives an input from the electrostatic spray current return path, designated as line 48. This return path current exits from current sensor 28 via line 49, but the voltage drop caused by the flow of this current through current sensor 28 is conveyed to operational amplifier 50 as an input voltage. The input voltage is conveyed to amplifier 710, where it is amplified and presented at output line 69, as a voltage signal which is representative of the ground-return current. The signal is also presented as an input to inverting amplifier 711. The other input to amplifier 711 is received from voltage amplifier 712, which produces a relatively constant, preset reference voltage output. Inverting amplifier 711 produces an output at line 68 which is representative of the output voltage from multiplier 36. This representation is possible by virtue of the essentially resistive load of multiplier 36, which may be assimulated by the amplifier circuits shown in FIG. 7; i.e., as the ground-return current signal on line 69 increases, the signal on line 68 representative of multiplier voltage correspondingly decreases. In the preferred embodiment the signal representative of multiplier voltage is utilized as the signal to be transmitted remotely according to the principles of the invention. However the signal representative of ground-return current could equally well be utilized for this purpose, and in fact both the current and voltage signals could be transmitted remotely utilizing the teachings of the invention.

Figure 8:
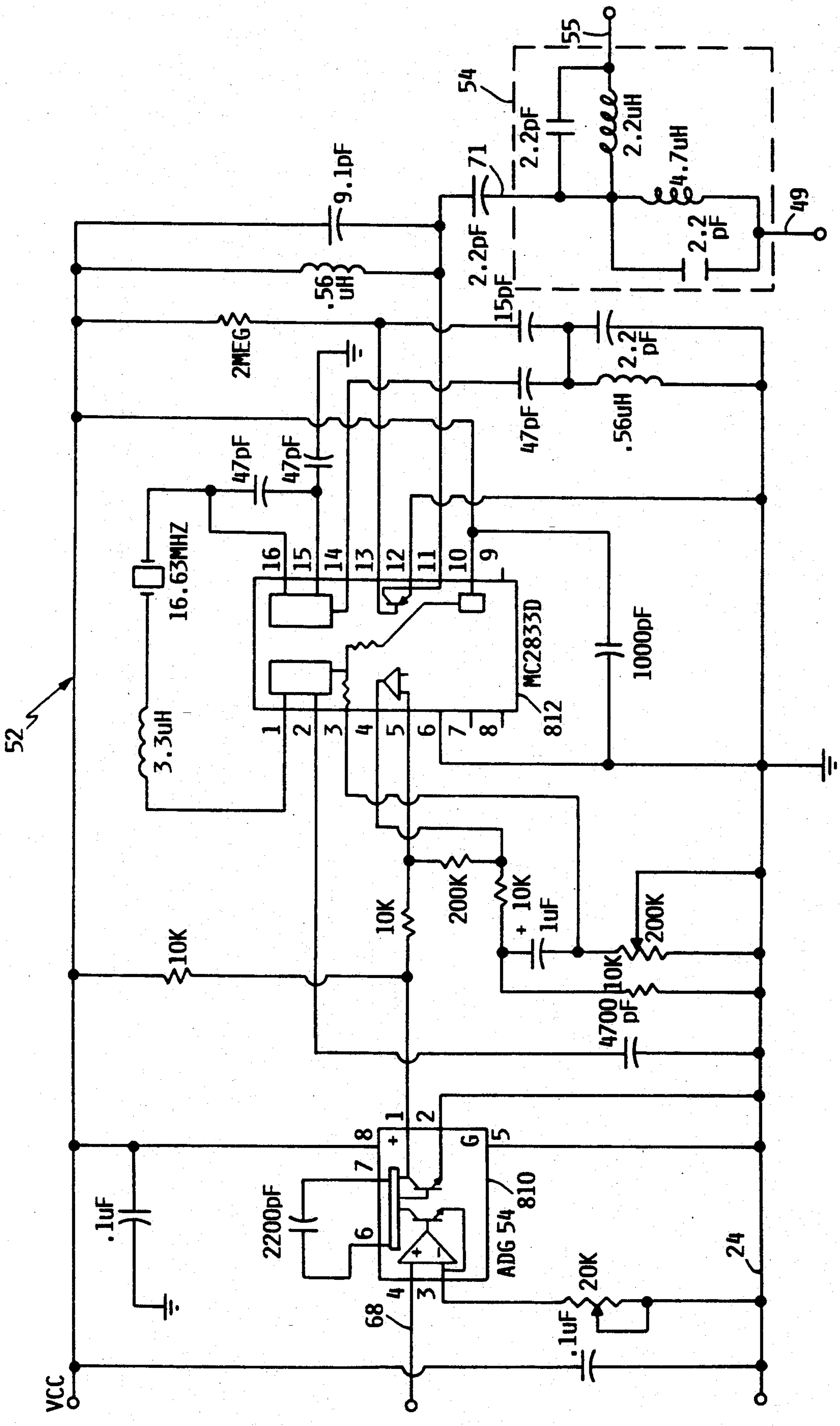
FIG. 8 shows a schematic diagram of the transmitter.

The voltage signal on line 68 is connected to the transmitter circuitry shown on FIG. 8, which develops an FM radio signal, the frequency of which is proportional to the voltage on line 68. The FM radio signal is transmitted via line 71 to filter 54. Filter 54 removes all stray frequencies, except for the FM transmitted frequency, and passes this frequency via line 55 to the ground return line of multiplier 36. The radio frequency signal is conveyed over the ground return line of multiplier 36 to electrode 38, where it is transmitted as a radio signal to the surrounding environment.

The circuitry of transmitter 52 operates more or less as a conventional FM transmitter. The signal received on line 68 is converted by a voltage-to-frequency converter 810 into a frequency signal. The voltage on line 68 may vary between zero and 1 volt, and the frequency output from inverter 810 varies from zero to 3,400 Hz. This frequency is presented as an input to transmitter circuit 812, which has a commercial type designation of MC2833D. Transmitter circuit 812 utilizes a crystal frequency of 16.63 MHz, and internally triples the frequency value to 49.890 MHz. The frequency variation resulting from voltage changes at line 68 modulates the frequency output of transmitter circuit 812 about this nominal carrier frequency +4,200 to −3,200 Hz. This output frequency is presented at output line 71, and is coupled to filter circuit 54. Filter circuit 54 removes frequencies other than the nominal modulated carrier frequency, and passes the nominal modulated carrier frequency to output line 55. Output line 55 is connected to the ground-return side of multiplier 36, and the signal is ultimately transmitted via the multiplier capacitors and resistors from electrode 38 to the surrounding area.

Figure 9A:
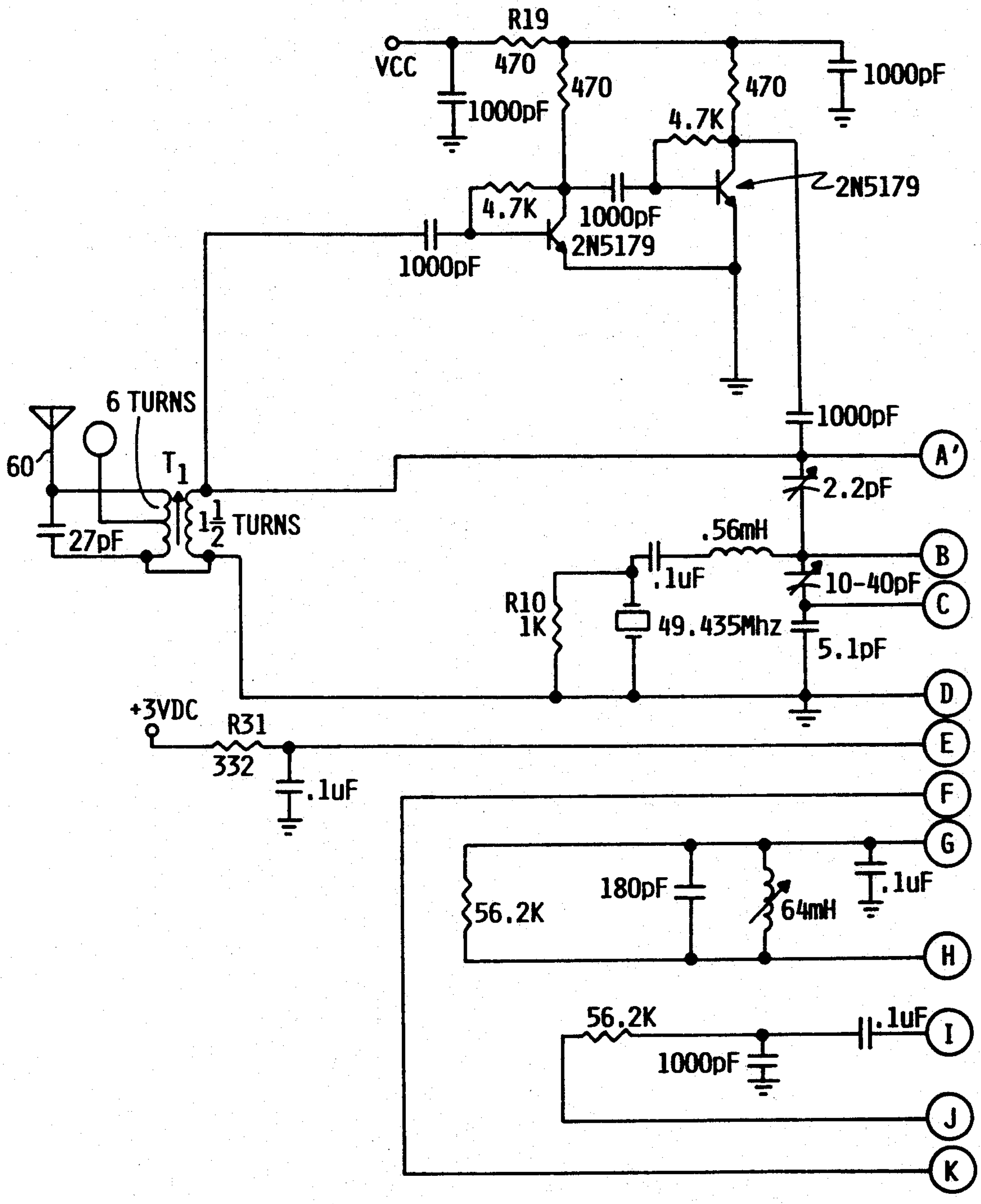
FIG. 9A and 9B each show a schematic diagram of portions of the receiver.
Figure 9B:
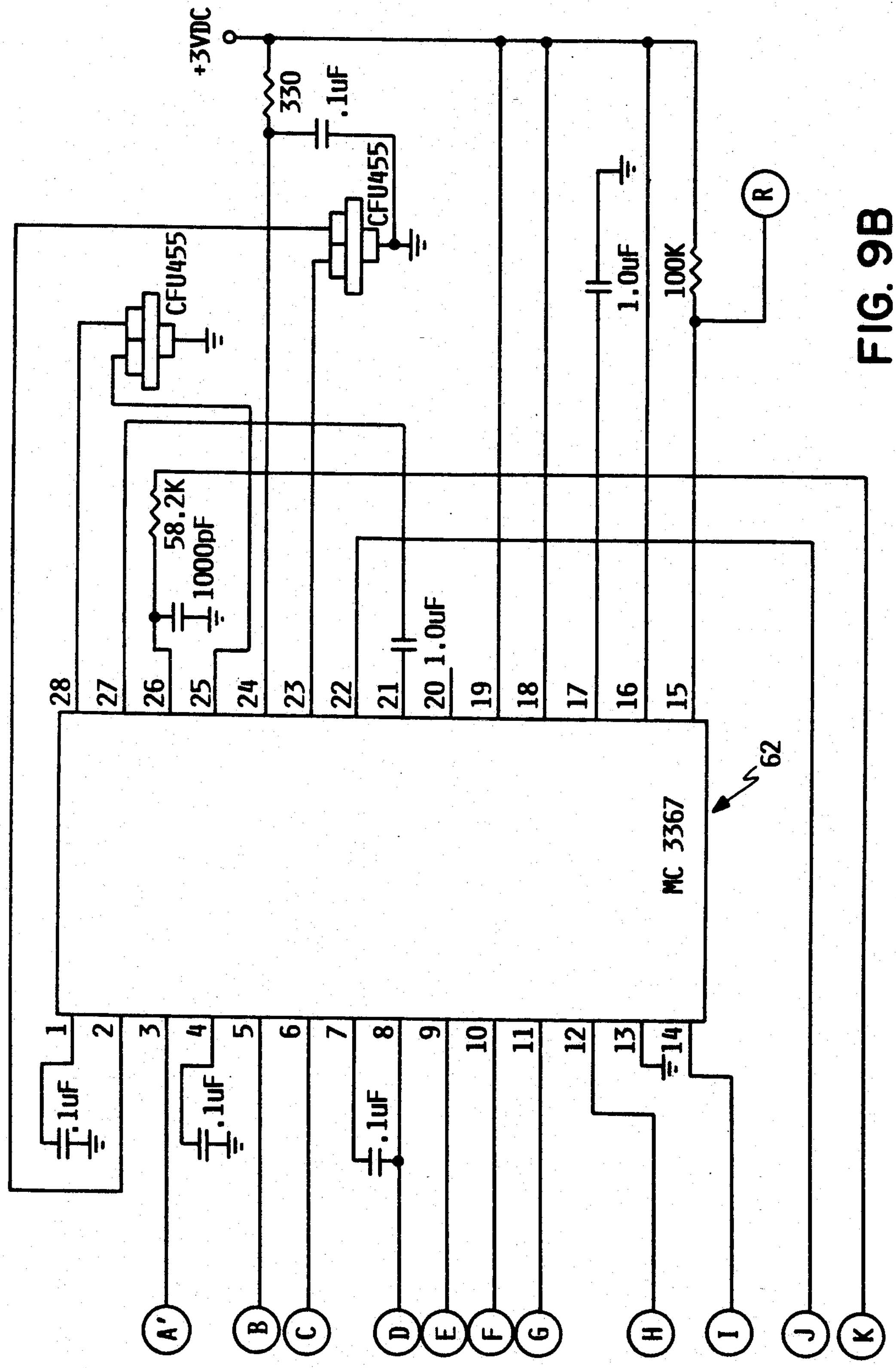

FIG. 9A and 9B show the schematic diagram of the receiver 62, including the antenna 60. Receiver 62 is a conventional FM receiver circuit, utilizing a semiconductor Type MC3367. The output signal from this circuit is applied at terminal R, and is coupled to the squelch circuit 64 shown on FIG. 10A. The signal applied at terminal R is a frequency signal corresponding to the frequency which was originally created by operational amplifier 50, and possibly also including frequency noise components which were picked up over the transmission path. The squelch circuit 64 is utilized to pass the usable frequency components and prevent the noise frequency components from being counted or displayed. To accomplish this purpose, the frequency input signal is transmitted along to squelch section channels, via lines 95 and 96, and simultaneously is passed to AND gate 97. The logic circuits connected to line 95, and the logic circuits connected to line 96, are utilized to develop a gating signal to the second input of AND gate 97. If conditions are met and the two channels of logic circuits connected to lines 95 and 96 respectively, the gating signal to AND gate 97 will be enabled, to thereby permit the input signal at terminal R to pass through the squelch section to output terminal S. If the logic conditions are not met, the gating signal to AND gate 97 will not be present and the input frequency signal at terminal R will be blocked from passage to output terminal S.

The logic circuits connected to line 95 monitor the pulse rate of the frequency signals to determine whether the frequency is greater or less than 400 Hz, which corresponds to a high voltage measurement of 10 Kv. If the logic circuits determine that the high voltage signal is less than 10 Kv, it is presumed that the frequency signals are caused by low frequency noise, or the high voltage electrode being shorted to ground, and are not representative of the actual high voltage signal. In this event, the gating input to AND gate 97 will be disabled. The logic circuits connected to line 96 measure the frequency to determine whether the frequency is greater or less than 3.85 KHz, which corresponds to the high voltage reading of 95 Kv. If the frequency signals are representative of a voltage greater than 95 Kv, it is presumed that the frequency signals are caused by high frequency noise, and the logic circuits connected to line 96 will therefore reject the signals. This also disables the gating signal to AND gate 97 and blocks the transmission of the frequency signal to output terminal S. If the frequency signals lie between 400 Hz and 3.85 KHz, both of the logic channels will be enabled, thereby enabling the gating input to AND gate 97, and enabling the passage of frequency signals from input terminal R to output terminal S.

Figure 10A:
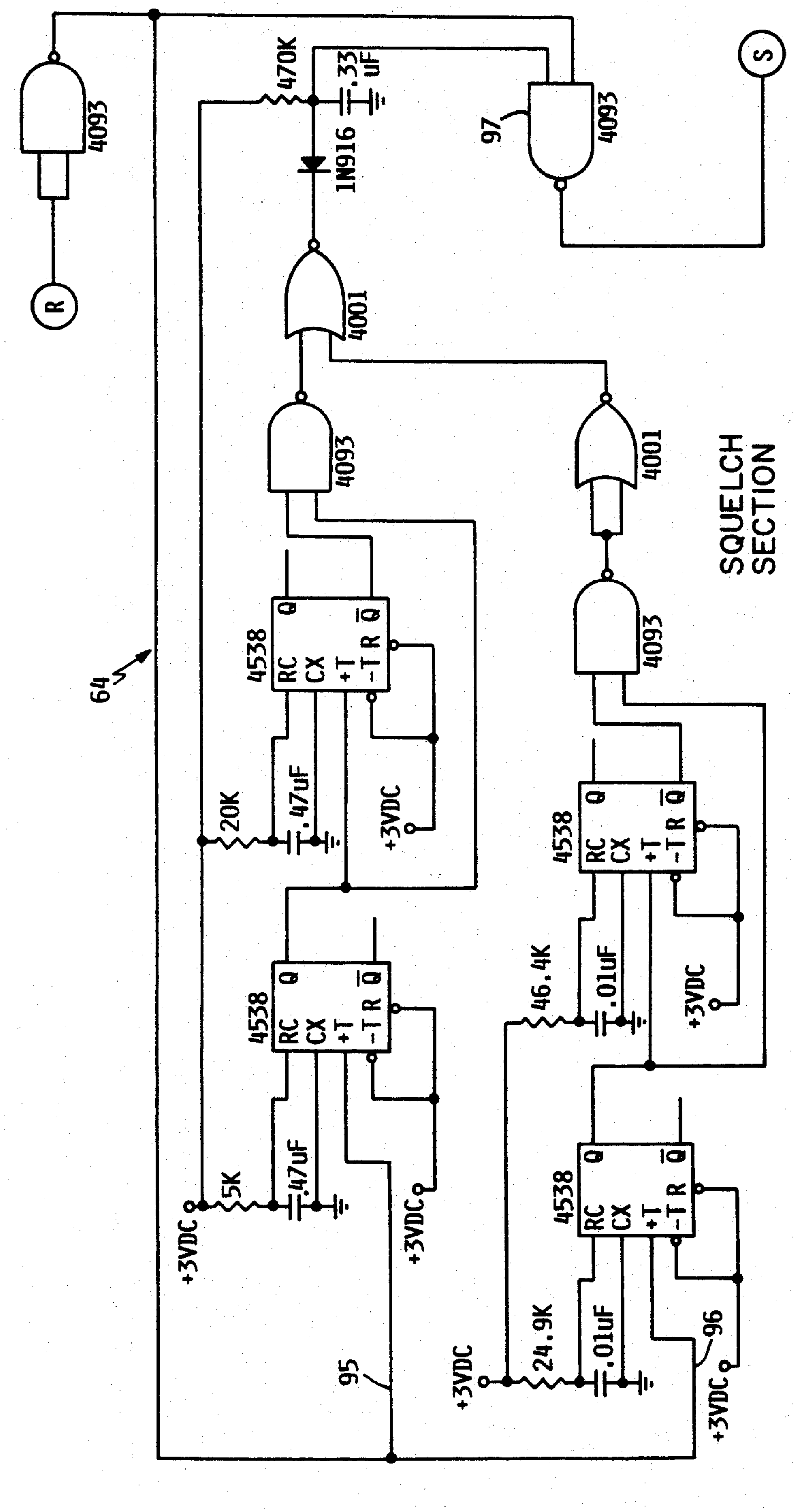
FIG. 10A shows a schematic diagram of the receiver squelch section.
Figure 10B:
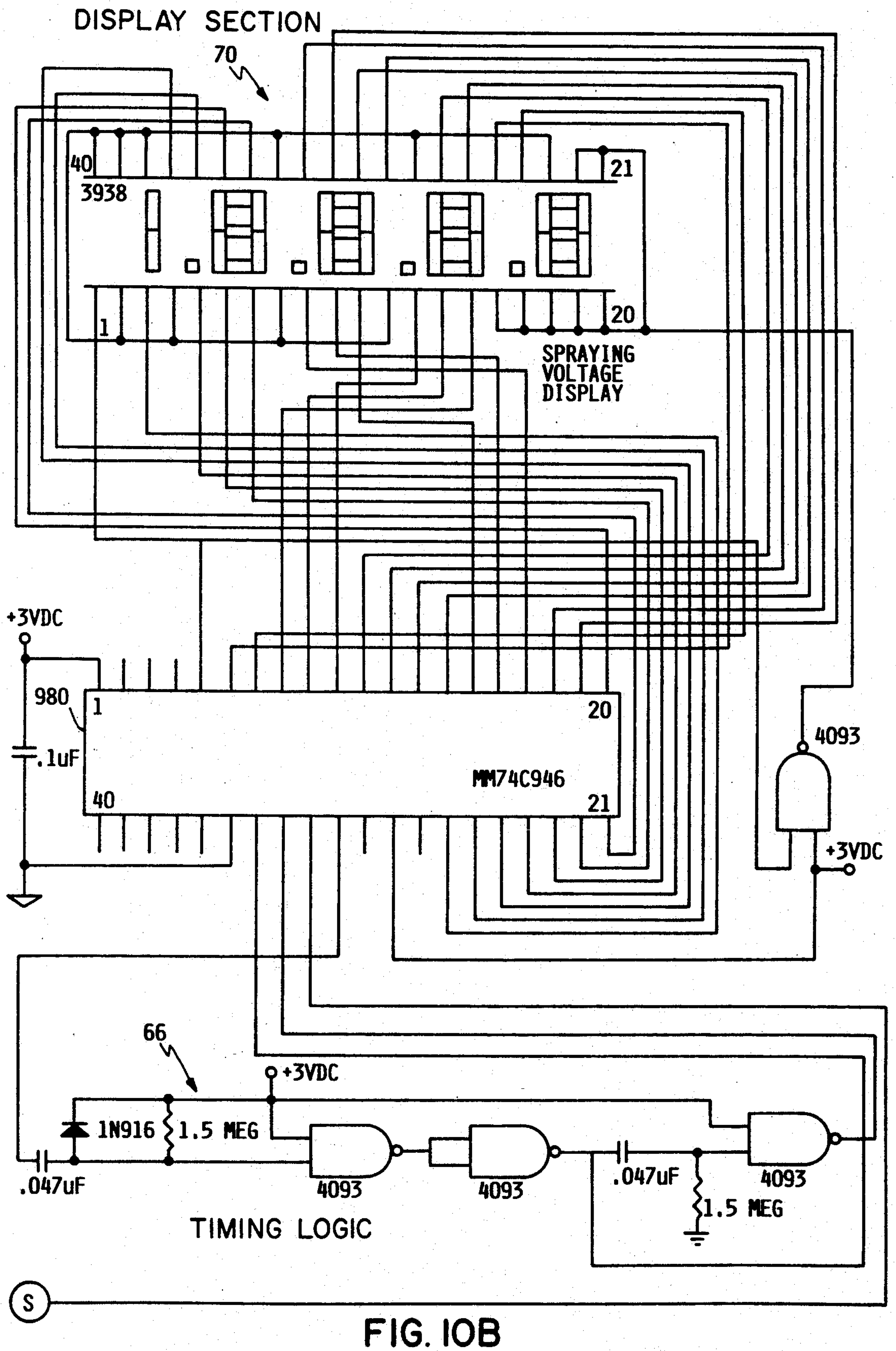
FIG. 10B shows a schematic diagram of the receiver logic and display.

The signals which are transmitted to output terminal S are received by the timing logic circuits shown on FIG. 10B. These signals are treated as clock signals into a counter 980, and in conjunction with timing logic signals from timing logic circuit 66, enabled the counter to accumulate a count of the frequency. Counter 980 is a commercial type designation MM74C946, which develops an 8-bit binary output signal to drive a digital display module 990. Digital display module 990 has a commercial type designation of 3938, and is designed to display a decimal equivalent of the binary count values generated by counter 980. Counter 980 and display module 990 are conventional commercial type designations, utilized in a manner which is well known in the prior art.

In operation, the spray gun operator activates the air supply to the spray gun by depressing the spray gun trigger, which automatically develops a predetermined high voltage output value as determined by the preset conditions within the spray gun and the various circuits described herein. The high voltage is released as an electrostatic field from the spray gun electrode and is directed to a grounded article which represents the object to be sprayed. The electrostatic field lines concentrate themselves on the grounded article and a perceptible flow of current passes from the spray gun to the grounded article. The current is returned to the spray gun via a ground-return line, where it is monitored and used to develop some of the control signals described herein. A signal representative of the current value is converted into a frequency value for transmission via the FM transmitter and electrode, and the transmitted signal is received by a receiver placed in proximity to the transmitter. The transmitted frequency and power levels are in compliance with federal regulations for such usage, and the received frequency signal is converted back into a logic signal for processing and display. The output display presents a digital representation of the spray gun spray voltage, although the invention could be constructed so as to provide a display of the spray gun current.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

I claim:

1. A liquid spray gun having a self-contained electrical power supply wherein electrical energy is developed from externally supplied air flow to the spray gun, comprising:

a) means for developing an electrostatic voltage and current within said spray gun, including means for externally directing an electrostatic field from said spray gun;
b) means for monitoring said electrostatic current in said spray gun and for developing a voltage signal responsive thereto, said voltage signal being proportional to said electrostatic voltage;
c) means for converting said voltage signal to a frequency signal, said frequency signal being proportional to said electrostatic voltage;
d) means for transmitting a high frequency carrier signal from said spray gun;
e) means for modulating said high frequency carrier signal with said frequency signal;
f) means for remotely receiving said modulated-carrier signal, including means for demodulating said carrier signal and recovering said frequency signal; and
g) means for converting said recovered frequency signal to a digital representation of said spray gun electrostatic voltage.

2. The apparatus of claim 1, wherein said means for transmitting a high frequency carrier signal further comprises means for applying said carrier signal to said means for externally directing an electrostatic field from said spray gun.

3. The apparatus of claim 2, wherein said means for monitoring said electrostatic current further comprises a small resistance in the ground-current return path in said spray gun, and means for monitoring the voltage drop across said small resistance.

4. The apparatus of claim 2, wherein said means for externally directing an electrostatic field from said spray gun further comprises a needle electrode projecting from said spray gun.

5. The apparatus of claim 4, further comprising means for limiting the maximum electrostatic current in said spray gun to less than 120 microamps.

6. In an electrostatic liquid spray gun of the type having an internal self-contained power supply operated from an external compressed air supply, the improvement comprising:

a) means for monitoring the electrostatic current in said spray gun and developing a voltage signal responsive thereto;

b) means for converting said voltage signal to a frequency signal, said frequency signal being proportional to said electrostatic current;

c) means for developing a high frequency carrier signal within said spray gun;

d) means for modulating said carrier signal with said frequency signal and developing a frequency-modulated radio signal therefrom; and e) means for transmitting said frequency-modulated radio signal from said spray gun.

7. The apparatus of claim 6, further comprising an electrostatic voltage electrode projecting from said spray gun, and wherein said means for transmitting said frequency-modulated radio signal further comprises transmitting from said electrode.

8. The apparatus of claim 7, further comprising radio receiver means for receiving said frequency-modulated radio signal, and means for demodulating said signal to recover said frequency signal.

9. The apparatus of claim 8, further comprising means for converting said frequency signal to a digital representation, and display means for displaying said digital representation.

* * * * *